(12) United States Patent
Schultz (10) Patent No.: US 8,675,168 B2
(45) Date of Patent: Mar. 18, 2014

(54) GAS GAUGE COMPATIBLE WITH VACUUM ENVIRONMENTS

(75) Inventor: Geoffrey Alan Schultz, Shelton, CT (US)

(73) Assignee: ASML Holding N.V., Veldhoven (NL)

( * ) Notice: Subject to any disclaimer, the term of this patent is extended or adjusted under 35 U.S.C. 154(b) by 341 days.

(21) Appl. No.: 12/809,171

(22) PCT Filed: Feb. 17, 2009

(86) PCT No.: PCT/EP2009/001101
§ 371 (c)(1),
(2), (4) Date: Jun. 18, 2010

(87) PCT Pub. No.: WO2009/103485
PCT Pub. Date: Aug. 27, 2009

(65) Prior Publication Data
US 2010/0309445 A1 Dec. 9, 2010

Related U.S. Application Data (60) Provisional application No. 61/030,084, filed on Feb. 20, 2008.

(51) Int. Cl.
*G03B 27/52* (2006.01)
*G03B 27/42* (2006.01)

(52) U.S. Cl.
USPC ............................................. 355/30; 355/53

(58) Field of Classification Search
USPC ................................................ 355/30, 53, 55
See application file for complete search history.

(56) References Cited

U.S. PATENT DOCUMENTS

| 3,754,433 | A | 8/1973 | Hyer |
| 5,386,716 | A | 2/1995 | Thurston et al. |
| 5,835,195 | A | 11/1998 | Gibson et al. |
| 7,021,120 | B2 | 4/2006 | Carter et al. |
| 7,265,364 | B2 | 9/2007 | Teunissen et al. |
| 7,549,321 | B2 | 6/2009 | Kochersperger et al. |

(Continued)

FOREIGN PATENT DOCUMENTS

| JP | 2005-338074 A | 12/2005 |
| JP | 2005-354073 A | 12/2005 |
| JP | 2007-218901 A | 8/2007 |

OTHER PUBLICATIONS

International Search Report mailed Dec. 30, 2009 for International Application No. PCT/EP2009/001101, 7 pgs.

(Continued)

*Primary Examiner* — Peter B Kim
(74) *Attorney, Agent, or Firm* — Sterne, Kessler, Goldstein & Fox P.L.L.C.

(57) ABSTRACT

A gas gauge (100) is provided for use in a vacuum environment having a measurement gas flow channel (105). The gas gauge comprises a measurement nozzle (110) in the measurement gas flow channel (105). The measurement nozzle (110) is configured to operate at a sonically choked flow condition of a volumetric flow being sourced from a gas supply (120) coupled to the measurement gas flow channel (105). The gas gauge (100) further comprises a pressure sensor (127) operatively coupled to the measurement gas flow channel (105) downstream from the sonically choked flow condition of the volumetric flow to measure a differential pressure of the volumetric flow for providing an indication of a gap (130) between a distal end of the measurement nozzle (135) and a target surface (140) proximal thereto.

10 Claims, 7 Drawing Sheets

(56) References Cited

U.S. PATENT DOCUMENTS

| | | |
|---|---|---|
| 2004/0201830 A1 | 10/2004 | Sewell et al. |
| 2005/0241371 A1 | 11/2005 | Carter et al. |
| 2005/0274909 A1 | 12/2005 | Teunissen et al. |
| 2006/0126041 A1 | 6/2006 | Van Dijsseldonk et al. |
| 2007/0151327 A1 | 7/2007 | Kochersperger |
| 2009/0009738 A1* | 1/2009 | Sasaki .......................... 355/53 |

OTHER PUBLICATIONS

Written Opinion mailed Sep. 2, 2010 for International Application No. PCT/EP2009/001101, 12 pgs.

* cited by examiner

GAS GAUGE COMPATIBLE WITH VACUUM ENVIRONMENTS

BACKGROUND

1. Field of the Invention

The present invention relates to the field of gas gauges suitable for use in vacuum environments of a lithographic apparatus.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage (WS), is exposed to an image projected onto the surface of the wafer by an exposure system located within a lithography system. The exposure system includes a reticle (also called a mask) for projecting the image onto the wafer.

The reticle is usually mounted on a reticle stage (RS) and generally located between the wafer and a light source. In photolithography, the reticle is used as a photo mask for printing a circuit on the wafer, for example. Lithography light shines through the mask and then through a series of optical lenses that shrink the image. This small image is then projected onto the wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be formed on the wafer. A wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lenses can be replaced by a mirror.

Photolithographic exposure tools map wafer topography in order to set focus. They typically employ an array of sensors lined up next to each other. Topographic data is taken form each one and stored, then an algorithm is employed to establish the best plane for the exposure step. However, optical means of determining focus positioning are subject to errors from interfering wave fronts from lower layers.

One alternate to the optical means is an air gauge since an air gauge does not suffer from the effects generally associated with optical means of determining focus positioning. An air gauge as an auxiliary focus sensor may be capable of detecting the topography of wafers with higher fidelity than the (optical) level sensor. Significant potential exists to expand the capabilities of the air gauge to the point that it becomes a viable replacement for a leveling sensor. Besides being a more accurate metrology device, particularly in an optically noisy environment of processed wafers, it is considerably less expensive and it occupies a significantly smaller volume.

Among developmental challenges to be overcome before such advancement can take place, there appears to be two prominent challenges. Firstly, since a typical air gauge has a relatively long response time, it limits the useful bandwidth to approximately ~50 Hz. Secondly, the fluidic response of the air gauge moving over the wafer topography with finite velocity may need adequate optimization of various controlling parameters. For example, shortening the response time of the air gauge requires a faster mass flow sensor (an internal component of the air gauge) and possibly shrinking the volume of the air passages.

Moreover, next generation lithography machines may use a vacuum environment to eliminate absorption losses and contamination. Operating an air gauge in these conditions will change the pneumatic operating conditions from low speed viscous flow to high speed, reaching sonic conditions. The high speed will produce much larger gas flow than can be accommodated in a vacuum environment and simple inlet throttling will reduce the bridge flow rates to levels that cannot be measured.

SUMMARY

What is needed is an air gauge for use in vacuum environments suitable for a lithographic apparatus.

In one embodiment of the present invention, there is provided a gas gauge for use in a vacuum environment having a measurement gas flow channel. The gas gauge may comprise a measurement nozzle in the measurement gas flow channel. The measurement nozzle may be configured to operate at a sonically choked flow condition of a volumetric flow being sourced from a gas supply coupled to the measurement gas flow channel. The gas gauge may further comprise a pressure sensor operatively coupled to the measurement gas flow channel downstream from the sonically choked flow condition of the volumetric flow to measure a differential pressure of the volumetric flow for providing an indication of a gap between a distal end of the measurement nozzle and a target surface proximal thereto.

According to another embodiment of the present invention, there is provided a lithography apparatus comprising a gas supply and a gas gauge for use in a vacuum environment. The gas gauge having a measurement nozzle which may be configured to operate at a sonically choked flow condition of a constant volumetric flow being supplied by the gas supply. The gas gauge may include a pressure sensor operatively coupled to the measurement nozzle downstream from the sonically choked flow condition of the volumetric flow to measure a differential pressure of the volumetric flow for providing an indication of a gap between a distal end of the measurement nozzle and a substrate proximal thereto. The lithography apparatus may further comprise an exposure station configured to expose the substrate to a beam of radiation comprising a pattern in its cross section.

According to a further embodiment of the present invention, there is provided a method for determining a focus position to set focus in a photolithographic exposure tool by mapping topography of a wafer in a vacuum environment. The method may comprise providing a gas supply and using in the vacuum environment a gas gauge having a measurement nozzle configured to operate at a sonically choked flow condition of a constant volumetric flow being supplied by the gas supply. The gas gauge may include a pressure sensor operatively coupled to the measurement nozzle downstream from the sonically choked flow condition of the volumetric flow to measure a differential pressure of the volumetric flow for providing an indication of a gap between a distal end of the measurement nozzle and a substrate proximal thereto. The method may further comprise exposing the substrate to a beam of radiation comprising a pattern in its cross section.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

This specification discloses one or more embodiments that incorporate the features of the present invention involving gas gauges suitable for use in vacuum environments of a lithographic apparatus, for example, in Extreme Ultraviolet Lithography (EUVL) Systems. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention provide gas gauges suitable for use in vacuum environments of a lithographic apparatus, for example, in Extreme Ultraviolet Lithography (EUVL) Systems. In a gas gauge, such as an air gauge by depressing an inlet pressure while still allowing a nozzle to reach sonic conditions, the requirement for low flow may be obtained. One advantage of this is seen in low Reynolds Numbers developed throughout the sensor which minimizes turbulent pneumatic noise. This flow condition is substantially different than conventional air gage sensors.

According to one embodiment of the present invention, by allowing the nozzle to operate above the choking point, the system becomes insensitive to changes in downstream pressure. This feature essentially eliminates the need to monitor the operating pressure ratio of the system.

Due to a low flow condition, a differential pressure sensor may ideally be used to measure the pressure response to changes in a sensor operating height. In order to limit the range of pressures that the sensor will see, a secondary nozzle may be used only to limit the differential pressure seen by the sensor and minimize errors introduced by an unsteady input.

For a gas gauge, a nozzle may be employed at a small operating gap, typically (but not limited to) 135 um. The inlet of the nozzle may be throttled using a porous restrictor set to produce a fixed nozzle inlet pressure at a desired flow rate. The nozzle may be allowed to reach sonic conditions at a nozzle exit, which develops a unique relation between flow, pressure and annulus. By holding the flow rate constant, the pressure may be solely a function of the annulus area which is indicative of the height that the nozzle is operating at.

Consistent with one embodiment of the present invention, an air gauge may be configured to produce many times, such as a 3-4 times more pneumatic gain than a conventional air gauge sensor. According to another embodiment of the present invention, a sealed housing may contain all elements that produce contaminants and may be continuously purged to limit the impact of even small leakage.

Process errors are inherent with optical topography systems. They are also strongly dependent upon the type and thickness of the resist used for a given process. In an EUV system, a resist used may be thinner than that employed in other processes. This means that there is an increased need for a process independent topographic system which can operate in vacuum. Although it is not intuitive that an air gauge can function with little air, or that a nozzle operating at sonic conditions could be quiet enough for accurate gap measurements, an air gauge consistent with one embodiment of the present invention may generally meet such requirements. This air gauge may be applied as a calibrator or as a primary sensor for establishing surface topography.

Figure 1:
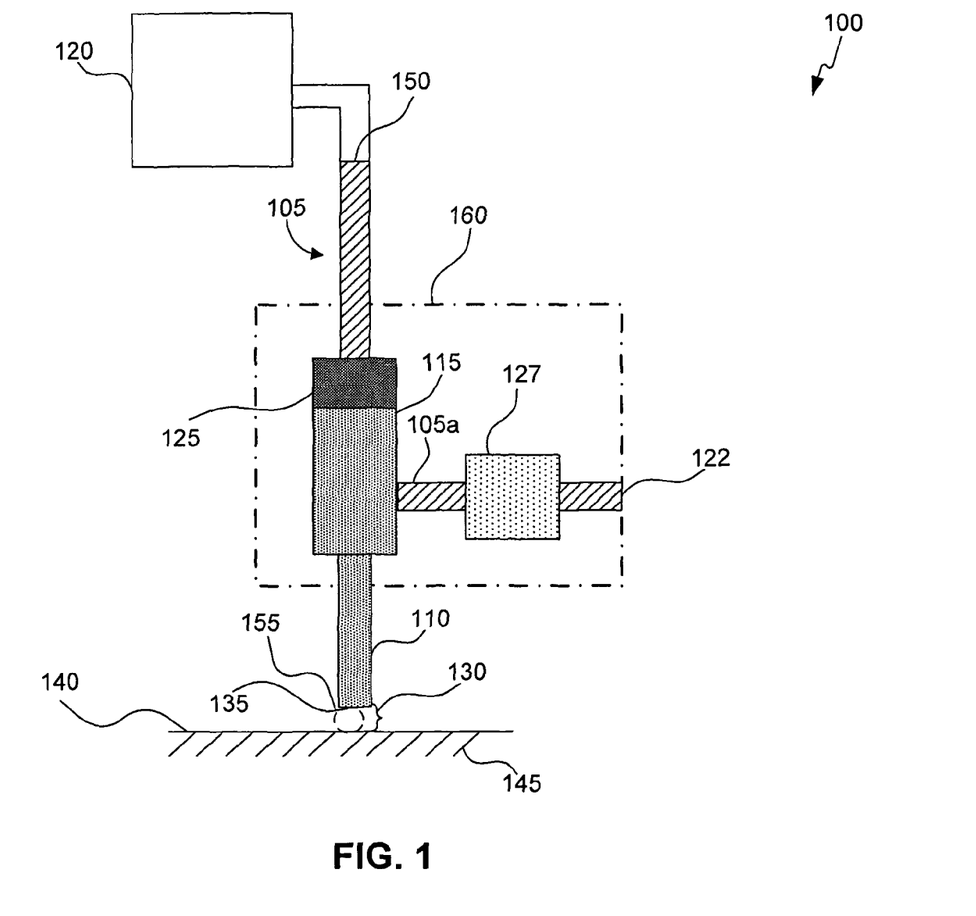
FIG. 1 schematically illustrates a side view of a gas gauge in accordance with one embodiment of the present invention.

FIG. 1 schematically illustrates a side view of a gas gauge 100 that may be compatible with vacuum environments in accordance with one embodiment of the present invention. For example, the gas gauge 100 may be suitable for use in a vacuum environment having a measurement gas flow channel 105. In an alternate embodiment however, the gas gauge 100 may also be used in an ambient environment.

Consistent with one embodiment of the present invention, the gas gauge 100 may comprise a measurement nozzle 110 in the measurement gas flow channel 105. The measurement nozzle 110 may be configured to operate at a sonically choked flow condition in an area 115 of a volumetric flow being sourced from a gas supply 120 coupled to the measurement gas flow channel 105. The gas supply 120 may include an air pump (not shown) that supplies air to a flow controller (not shown) for maintaining a constant rate of air flow into the gas gauge 100. The air may pass through a filter (not shown) before entering into the measurement gas flow channel 105, which ultimately leads to the measurement nozzle 110. To ensure a common flow rate to the measurement nozzle 110 and a secondary pressure port 122, a first flow restrictor 125 may be placed in the measurement gas flow channel 105. The first flow restrictor 125 may create the sonically choked flow condition and have the effect of damping out upstream pressure and flow oscillations or disturbances.

The gas gauge 100 may further comprise a pressure sensor 127 operatively coupled to the measurement gas flow channel 105 downstream from the sonically choked flow condition area 115 of the volumetric flow to measure a differential pressure of the volumetric flow for providing an indication of a gap 130 between a distal end 135 of the measurement nozzle 110 and a target surface 140 of a target 145 proximal thereto.

In one embodiment of the present invention, the pressure sensor 127 may be a differential pressure sensor. One example of the differential pressure sensor is a capacitive pressure sensor having a bandwidth of 1000 Hz and a size less than 25 mm cube. Persons ordinarily skilled in the pertinent art would recognize that such type of differential pressure sensors are widely used and are generally available from MKS Instruments of Andover, Mass. Consistent with one embodiment of the present invention, the pressure sensor 127 may comprise a pressure receiving diaphragm having a conductive layer, and a fixed electrode located opposite to the diaphragm and connected to a capacitance detecting circuit. The capacitance detecting circuit may electrostatically sense displacement of the inner portion of the diaphragm to detect a differential pressure, by using fluctuation in capacitance produced between the diaphragm and the fixed electrode.

The measurement gas flow channel 105 may be connected via a differential flow channel 105a. The differential flow channel 105a may include the pressure sensor 127 between the measurement gas flow channel 105 and the secondary pressure port 122. If the pressure at the measurement nozzle 110 is substantially equal to the pressure at the secondary pressure port 122, there is no flow across the pressure sensor 127. However, if the distance between the measurement nozzle 110 and, for example, the target 145 such as a wafer changes relative to the distance between the distal end 135 of the measurement nozzle 110, the pressure at the measurement nozzle 110 will also change. A movement of air to or from, for example, the secondary pressure port 122 and the measurement gas flow channel 105 creates a differential pressure, across the differential flow channel 105a. This difference in pressure is detected by the pressure sensor 127. For example, the pressure sensor 127 may measure the differential pressure of the volumetric flow between a first pressure level of the measurement nozzle 110 and a second pressure level of the secondary pressure port 122. Once detected, the distance between the measurement nozzle 110 and the target surface 140 may be measured.

In this way, the gas gauge 100 may provide a measure of an offset distance in the gap 130 based on a signal of the differential pressure from the pressure sensor 127. For determining a focus position by mapping topography of a wafer, the first flow restrictor 125 may be located upstream of the pressure sensor 127 and configured to depress pressure at an inlet 150 of the measurement gas flow channel 105 while allowing the measurement nozzle 110 to reach the sonically choked flow condition for gas flowing at a substantially constant flow rate from the gas supply 120. The inlet 150 of the measurement gas flow channel 105 may be configured to receive the gas from the gas supply 120.

In one embodiment, the gas supply 120 and the first flow restrictor 125 may be configured to maintain a ratio between gas pressure directly upstream of an exit (the distal end 135) of the measurement nozzle 110 and directly downstream of the exit of the measurement nozzle 110 in an annulus area 155 substantially equal to or greater than a threshold value corresponding to a maximum expected gas pressure directly downstream of the exit of the measurement nozzle 110.

The gas gauge 100 may further comprise a sealed housing 160 to enclose the measurement gas flow channel 105 and the pressure sensor 127 for providing a contamination barrier in the vacuum environment. The gas gauge 100 in the vacuum environment may operate choked with a desired flow of the gas at the distal end 135 of the measurement nozzle 110 such that the gas supply 120 provides a constant flow of air or Nitrogen. The secondary pressure port 122 may be configured to vent gas from the gas supply 120 in the vacuum environment. When the target surface 140 is of a wafer, the gas gauge 100 may enable establishing of a best plane for an exposure step in a wafer processing procedure being performed by a lithography apparatus.

Figure 2:
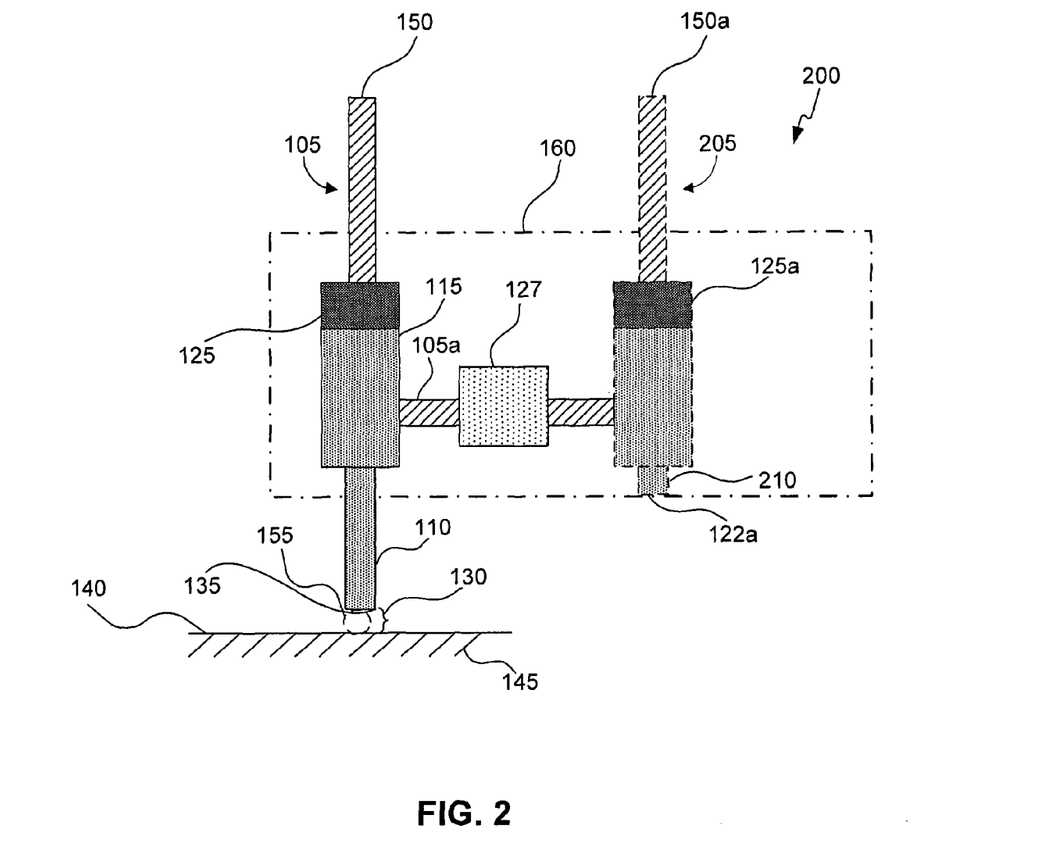
FIG. 2 schematically illustrates a side view of an air gauge for use in a vacuum environment according to one embodiment of the present invention.

FIG. 2 schematically illustrates a side view of a gas gauge such as an air gauge 200 for use in a vacuum environment according to one embodiment of the present invention. The air gauge 200 may include a secondary gas flow channel 205. The secondary gas flow channel 205 may comprise a secondary nozzle 210 in the secondary gas flow channel 205. The secondary nozzle 210 may be operatively coupled to the pressure sensor 127 to enable the pressure sensor 127 to measure the differential pressure of the volumetric flow between a first pressure level of the measurement nozzle 110 and a second pressure level of the secondary nozzle 210.

In the air gauge 200, the secondary nozzle 210 may either limit a range of measurement for the differential pressure that the pressure sensor 127 to obtain or counteract a variation in a constant mass flow to the measurement nozzle 110 from the gas supply 120. The air gauge 200 may provide a measure of an offset distance in the gap 130 based on a signal of the differential pressure from the pressure sensor 127 for determining a focus position by mapping topography of a wafer.

Consistent with one embodiment of the present invention, the secondary gas flow channel 205 of the air gauge 200 further comprises a second flow restrictor 125a located upstream to the pressure sensor 127. The second flow restrictor 125a may be configured to depress pressure at an inlet 150a of the secondary gas flow channel 205 for gas flowing at a substantially constant flow rate from the gas supply 120. The inlet 150a of the secondary gas flow channel 205 may be configured to receive the gas from the gas supply 120. The secondary nozzle 210 may be configured to vent gas in the vacuum environment from the gas supply 120.

Figure 3:
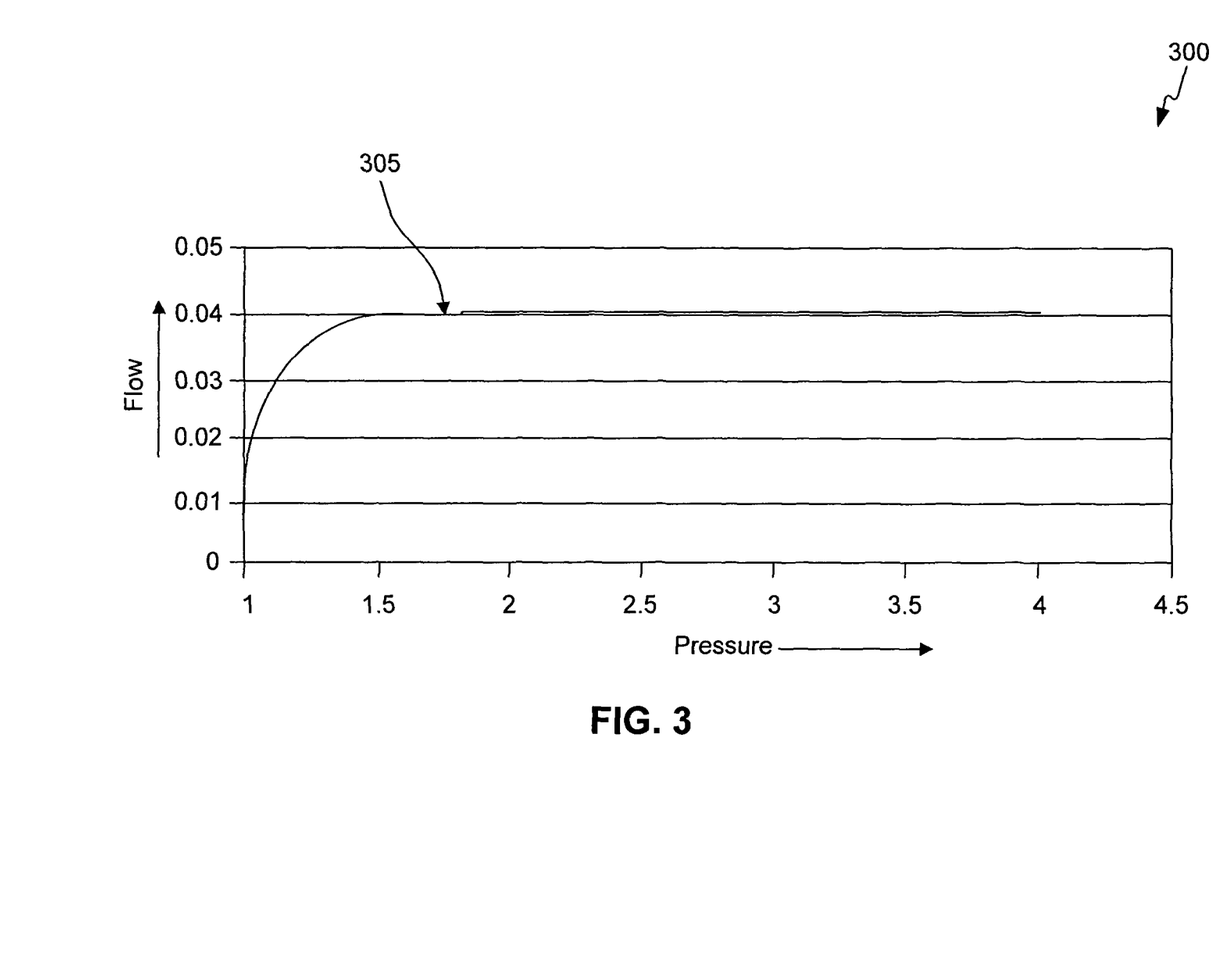
FIG. 3 schematically illustrates a plot showing a flow rate of air as a function of pressure to realize a sonically choked flow condition of a volumetric flow according to one embodiment of the present invention.

FIG. 3 schematically illustrates a plot 300 showing a flow rate of air (Flow) as a function of the pressure (Pr) to realize a sonically choked flow condition 305 of a volumetric flow according to one embodiment of the present invention. The sonically choked flow condition 305 of a volumetric air flow from the gas supply 120 that may be supplying air being choked by the first flow restrictor 125 is a dynamic condition caused by the Venturi effect. When a flowing gas at a certain pressure and temperature flows through the first flow restrictor 125 (such as a hole in an orifice plate or a valve in a pipe)

into a lower pressure environment, under the conservation of mass the flow velocity must increase for initially subsonic upstream conditions as it flows through the smaller cross-sectional area of the first flow restrictor 125. At the same time, the Venturi effect causes the pressure to decrease.

The sonically choked flow condition 305 is a limiting condition which occurs when the mass flux will not increase with a further decrease in the downstream pressure environment. For homogenous gases such as air or Nitrogen, the physical point at which the choking occurs for adiabatic conditions is when the exit plane velocity is at sonic conditions or at least at a Mach number of 1. Such choked flow of gases is useful in many engineering applications because the mass flow rate is independent of the downstream pressure, depending only on the temperature and pressure on the upstream side of the first flow restrictor 125. Under the sonically choked flow condition 305, a calibrated first flow restrictor 125 may be used to produce a particular mass flow rate.

In accordance with one embodiment of the present invention, a sensor based on the air gauge 200 may measure "true" offset distance as the gap 130 between the distal end 135 of the measurement nozzle 110 and a close proximity surface, such as the target surface 140. The air gauge 200 in a vacuum environment may operate choked. For example, a EUV vacuum environment may be defined by a max flow=0.1 lpm with "ambient" pressure<0.1 mbar in one specific application for lithographic processing. The choked flow may be defined as Mach 1 at the exit or the distal end 135. A choke boundary may be expected at the measurement nozzle 110.

For creating the sonically choked flow condition 305, a ratio between upstream pressure ($P_{upstream}$) an downstream pressure ($P_{downstream}$) may be maintained as $P_{upstream}/P_{downstream}>1.893$. Other governing equations for the sonically choked flow condition 305 include: Restrictor ($\Delta P = k\, Q\, L/A$); Friction ($\Delta P = \frac{1}{2} f\, L/D\, \rho\, (Q/A)^2$); Area change ($\Delta P = \frac{1}{2} \rho\, (Q/A)^2\, (A2/A1)^2 - 1$); Nozzle ($\Delta P = P_{in}\, (1 - (1+(\gamma-1)/2\, M^2))\, (\gamma/(\gamma+1))$). Likewise, the operational parameters may include Pressure: 100 mbar to 0.1 mbar, ~100 mbar net drop; Flow: 0.1 nlpm, the Gap 130: 135 µM gap; Pneumatic gain: (pressure) 126 mPa/nm (flow) 4.5×10−7 nlpm/nm (may not be measurable as flow). In this way, the air gauge 200 blowing into vacuum becomes feasible by using the pressure sensor 127 instead of a mass flow sensor.

Figure 4:
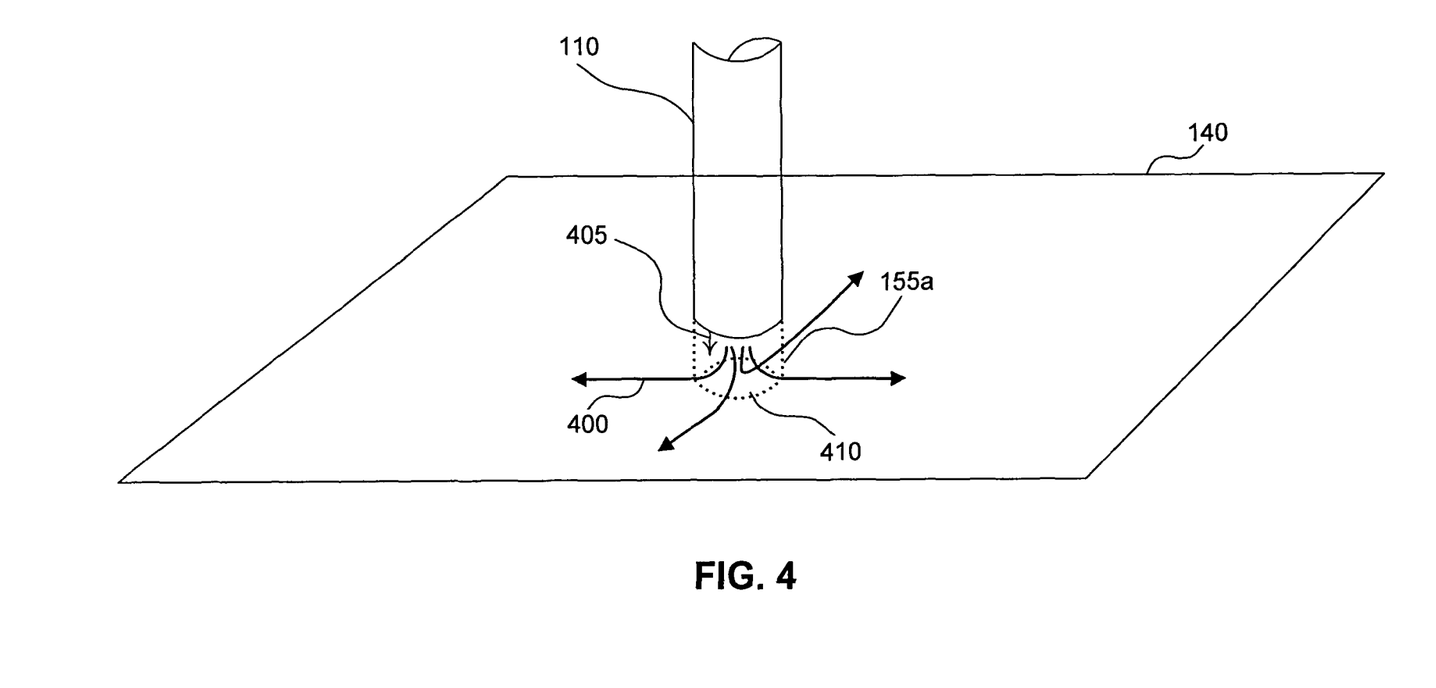
FIG. 4 schematically illustrates formation of annulus according to an embodiment of the present invention.

FIG. 4 schematically illustrates formation of an annulus 155a according to an embodiment of the present invention. The annulus 155a refers to a ring-shaped geometric figure, or more generally, a ring-shaped object. The annulus 155a may be a void between the measurement nozzle 110 and the target surface 140 immediately surrounding it where a gas such as air or Nitrogen can flow from the gas supply 120 after it is being choked.

In operation, the gas supply 120 and the first flow restrictor 125 may be configured to maintain a ratio between gas pressure directly upstream ($P_{upstream}$) of an exit (the distal end 135) of the measurement nozzle 110 and directly downstream ($P_{downstream}$) of the exit of the measurement nozzle 110 in the annulus's 155a area. This ratio may be maintained substantially equal to or greater than a threshold value corresponding to a maximum expected gas pressure directly downstream of the exit of the measurement nozzle 110.

In the air gauge 200, the measurement nozzle 110 may be set at a small operating gap 130 and the inlet 150 of the measurement nozzle 110 may be throttled using a porous restrictor such as the first flow restrictor 125 set to produce a fixed nozzle inlet pressure at a desired flow rate. The measurement nozzle 110 may be operated so as to reach sonic conditions at a nozzle exit (the distal end 135), which develops a unique relation between a Flow 400, a Pressure as shown by an arrow 405 and an annulus area 410. By holding the flow rate constant, the Pressure 405 may be solely a function of the annulus area 410 which is indicative of a height or the gap 130 that the measurement nozzle 110 is operating at.

Accordingly, the air gauge 200 into vacuum may operate in a choked flow regime, producing sufficient pneumatic gain to function while using the pressure sensor 127. Consistent with one embodiment of the present invention, the air gauge 200 may be configured to produce 3-4 times more pneumatic gain than a conventional air gauge sensor.

Figure 5:
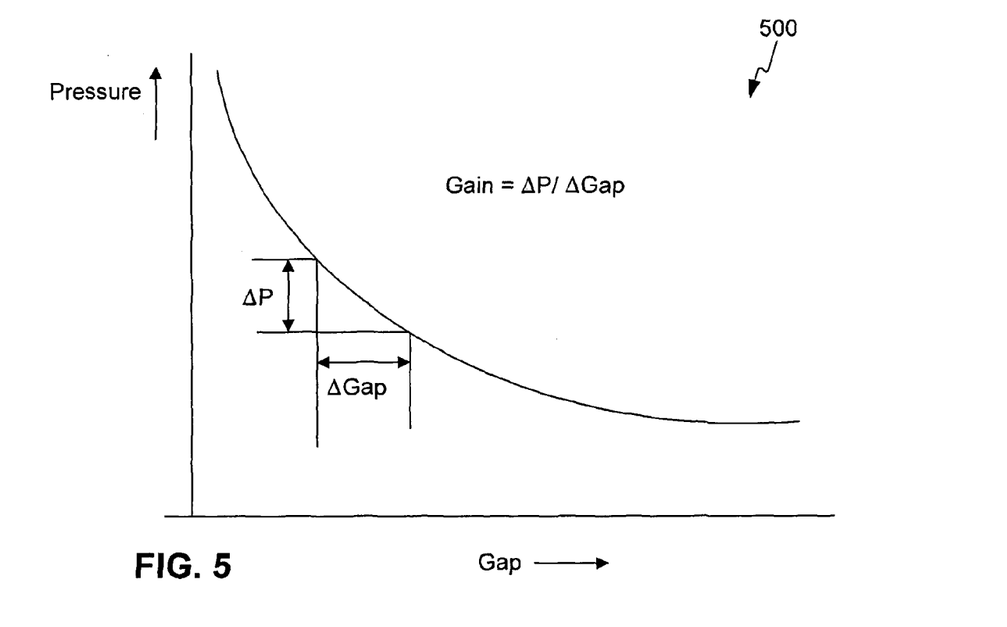
FIG. 5 schematically illustrates a plot showing pressure as a function of a gap for indicating gain according to one embodiment of the present invention.

FIG. 5 schematically illustrates a plot 500 showing the Pressure 405 as a function of the gap 130 for indicating gain according to one embodiment of the present invention. In one embodiment of the present invention, pneumatic data for operation in atmospheric conditions may include the Flow 400=58 Slpm, the Pressure 405=312 kPa, and the Gain=250 pa/um.

Figure 6:
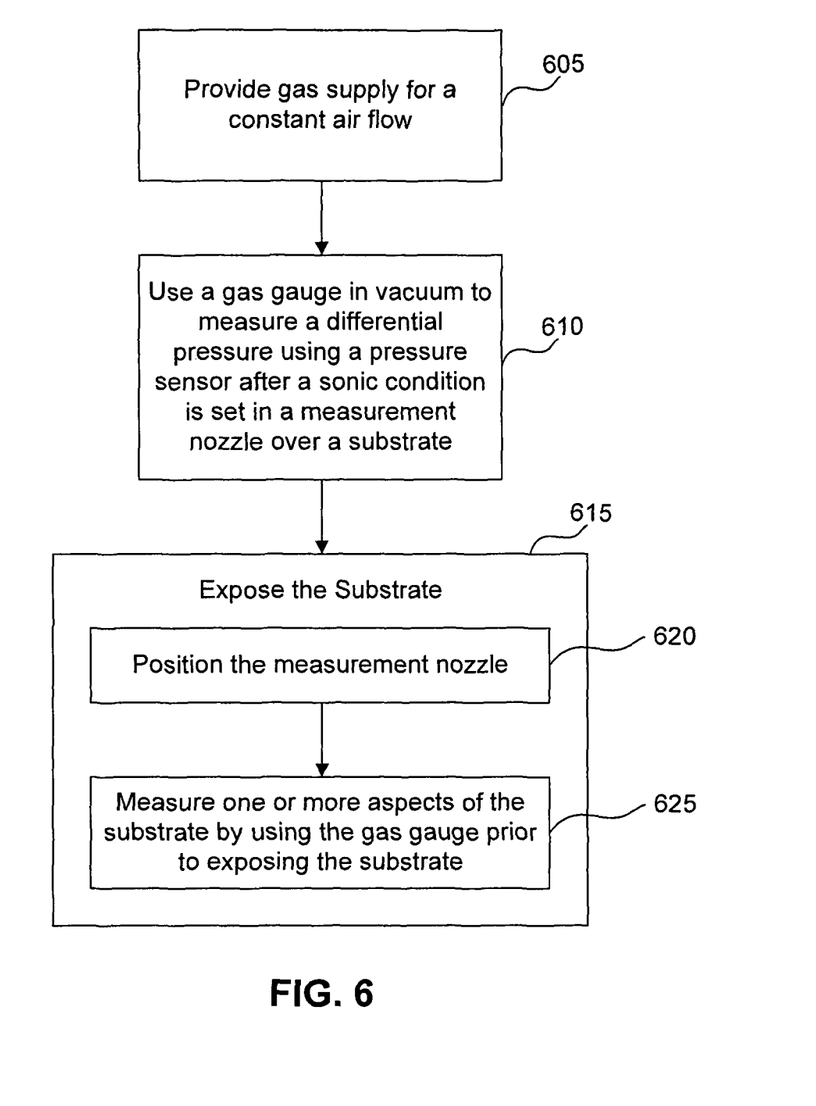
FIG. 6 schematically shows a block diagram of a method for determining a focus position to set focus in a photolithographic exposure tool by mapping topography of a wafer in a vacuum environment according to one embodiment of the present invention.

FIG. 6 schematically shows a block diagram of a method 600 for determining a focus position to set focus in a photo-lithographic exposure tool by mapping topography of a wafer in a vacuum environment according to one embodiment of the present invention. The steps of the method 600 are for illustrative purpose only, and do not have to take place in the order shown. There may be additional intermediate steps that are not shown in FIG. 6. Some of the steps may be optional, and/or specific to particular embodiments. All embodiments may not use all the steps shown in FIG. 6. Additionally, components shown in FIGS. 1 and 2 are configured to execute various functional steps shown in FIG. 6. However, the method 600 is not limited to the embodiment shown in FIGS. 1 and 2, and can be executed by other system embodiments as well.

As shown in block 605, the method 600 may comprise providing a supply of gas such as air or Nitrogen from the gas supply 120.

As shown in block 610, the method 600 may further comprise using in the vacuum environment the gas gauge 100 having the measurement nozzle 110. The measurement nozzle 110 may be configured to operate at a sonically choked flow condition of a constant volumetric flow being supplied by the gas supply 120. The gas gauge 100 may include the pressure sensor 127, which may be operatively coupled to the measurement nozzle 110 downstream from the sonically choked flow condition of the volumetric flow to measure a differential pressure of the volumetric flow. The measure of the differential pressure may indicate height of the gap 130 between the distal end 135 of the measurement nozzle 110 and the target 145's surface 140 such as a substrate surface proximal to the measurement nozzle 110. As shown in block 615, the method 600 may additionally comprise exposing the substrate to a beam of radiation comprising a pattern in its cross section.

As shown in block 620, exposing the substrate to a beam of radiation comprising a pattern in its cross section may further comprise positioning the measurement nozzle and the substrate such that the gas vented from the measurement nozzle 110 impinges on the substrate. As shown in block 625, the method 600 may also comprise measuring one or more aspects of the substrate by using the gas gauge 100 prior to exposing the substrate.

Figure 7:
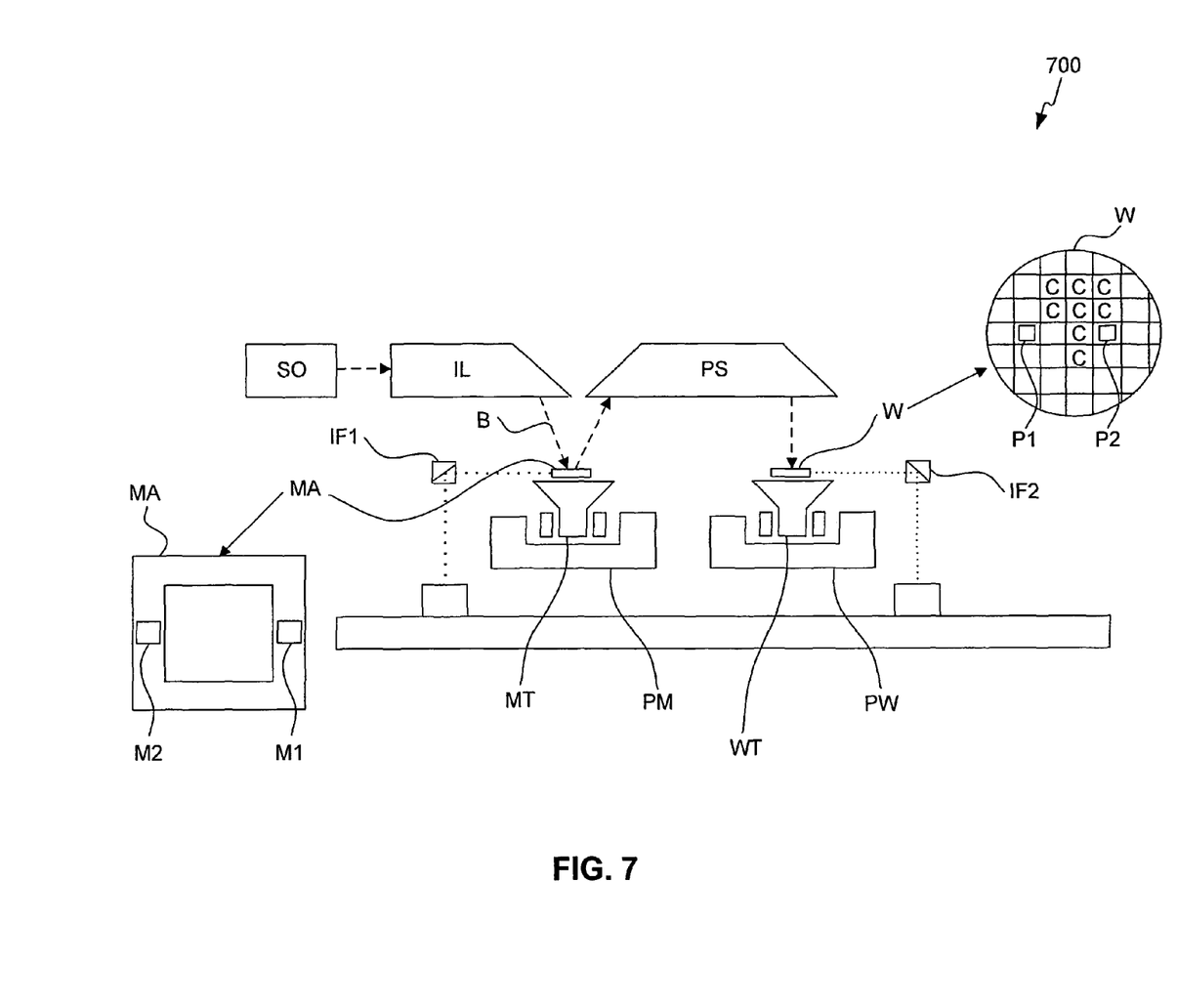
FIG. 7 depicts a lithographic apparatus such as an EUV photolithographic system according to an embodiment of the present invention.

FIG. 7 schematically depicts a lithographic apparatus 700 for using the air gauge 200 shown in FIG. 2 in a vacuum environment according to one embodiment of the present invention. The lithography apparatus 700 may comprise the gas supply 120 shown in FIG. 1, the gas gauge 100 as shown in FIG. 1 for use in a vacuum environment having the measurement nozzle 110 configured to operate at a sonically choked flow condition of a constant volumetric flow being supplied by the gas supply 120. As described above, the gas gauge 100 may include the pressure sensor 127 operatively coupled to the measurement nozzle 110 downstream from the sonically choked flow condition of the volumetric flow to measure a differential pressure of the volumetric flow. This measurement may provide an indication of the gap 130 between the distal end 135 of the measurement nozzle 110 and a substrate such as the target 145 proximal thereto.

Within the lithography apparatus 700, a conventional exposure station may be configured to expose the substrate to a beam of radiation comprising a pattern in its cross section. Additionally the lithography apparatus 700 may comprise a conventional measurement station which may be configured to measure one or more aspects of the substrate by using the gas gauge prior to exposing the substrate. The measurement nozzle 110 and the substrate may be positioned such that the gas vented from the measurement nozzle 110 impinges on the substrate such as the target 145. The lithography apparatus 700 may further comprise a conventional substrate stage compartment that is configured to comprise a substrate stage configured to support the substrate during illumination of the substrate with a beam with a patterned cross section.

In one embodiment, the lithography apparatus 700 may further comprise a conventional lithography leveling system that includes the gas gauge 100. In another embodiment, the lithography apparatus 700 may further comprise a conventional lithography topography mapping device that includes the gas gauge 100. In an alternate embodiment, the lithography apparatus 700 may further comprise a conventional proximity sensor for lithography that includes the gas gauge 100.

Consistent with one embodiment of the present invention, the apparatus 700 may comprise an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus 700, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus 700 is of a reflective type (e.g. employing a reflective mask). Alternatively, the apparatus 700 may be of a transmissive type (e.g. employing a transmissive mask).

The lithographic apparatus 700 may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus 700 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus 700, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 7, the illuminator IL receives a radiation beam from a radiation source SO. The source and the lithographic apparatus 700 may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus 700, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 700 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The above description refers to light, light sources and beams of light. It will be appreciated that the light referred to is not limited to light having a visible wavelength, and can include other wavelengths including ultraviolet light or infrared light which are suitable for lithography, as discussed above.

For example, an EUV photolithographic system may include an EUV source. The EUV photolithographic system may also includes image optics including mirrors, a pupil, a reflective reticle mounted on a reticle stage (RS) with an image of a pattern to be imaged onto a wafer 805, and projection optics (PO) mirrors. The EUV radiation is then projected onto a wafer, which is mounted on a wafer stage (WS, not shown). It will be appreciated that the reticle is reflective in EUV systems, unlike photolithographic systems operating at longer wavelengths, such as deep ultraviolet, or visible, where the reticle is usually transmissive, although the invention is applicable to both types of reticles.

Although specific reference can be made in this text to the use of lithographic apparatus 700 in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

The invention claimed is:

1. A lithography apparatus, comprising:
    a gas gauge configured to be used in a vacuum environment, the gas gauge comprising,
    a measurement nozzle configured to operate at a sonically choked flow condition of a gas being supplied by a gas supply,
    a pressure port, and
    a pressure sensor operatively coupled between the pressure port and the measurement nozzle downstream from the sonically choked flow condition of the gas and configured to measure a differential pressure between a first pressure within the measurement nozzle and a second vacuum pressure at the pressure port to provide an indication of a gap between a distal end of the measurement nozzle and a substrate proximal thereto; and
    an exposure station configured to expose the substrate to a beam of radiation comprising a pattern in its cross section.

2. The lithography apparatus of claim 1, further comprising:
    a measurement station configured to measure one or more aspects of the substrate by using the gas gauge prior to exposing the substrate.

3. The lithography apparatus of claim 1, wherein the measurement nozzle and the substrate are positioned such that the gas vented from the measurement nozzle impinges on the substrate.

4. The lithography apparatus of claim 1, further comprising:
    a substrate stage compartment configured to comprise a substrate stage configured to support the substrate during illumination of the substrate with a beam with a patterned cross section.

5. The lithography apparatus of claim 1, further comprising:
    a lithography leveling system including the gas gauge.

6. The lithography apparatus of claim 1, further comprising:
    a lithography topography mapping device that includes the gas gauge.

7. The lithography apparatus of claim 1, further comprising:
    a proximity sensor for lithography that includes the gas gauge.

8. A method comprising:
    using, in a vacuum environment, a gas gauge having a measurement nozzle configured to operate at a sonically choked flow condition of a gas being supplied by a gas supply,
    measuring, using a pressure sensor, a differential pressure between a first pressure within the measurement nozzle and a second vacuum pressure at a pressure port, the pressure sensor being coupled between the pressure port and the measurement nozzle downstream from the sonically choked flow condition of the gas; and
    producing, using the pressure sensor, an indication of a gap between a distal end of the measurement nozzle and a substrate proximal thereto determining, based on the gap, a focus position to set focus in a photolithographic exposure tool by mapping topography of a substrate in a vacuum environment.

9. The method of claim 8, further comprising:
    impinging gas vented from the measurement nozzle on the substrate.

10. The method of claim 8, further comprising:
    measuring one or more aspects of the substrate by using the gas gauge prior to exposing the substrate.

* * * * *